United States Patent
In't Veld et al.

(10) Patent No.: US 7,115,443 B2
(45) Date of Patent: Oct. 3, 2006

(54) METHOD AND APPARATUS FOR MANUFACTURING A PACKAGED SEMICONDUCTOR DEVICE, PACKAGED SEMICONDUCTOR DEVICE OBTAINED WITH SUCH A METHOD AND METAL CARRIER SUITABLE FOR USE IN SUCH A METHOD

(75) Inventors: Frederik Hendrik In't Veld, Eindhoven (NL); Johannes Hermanus Savenije, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/523,534

(22) PCT Filed: Jul. 31, 2003

(86) PCT No.: PCT/IB03/03712

§ 371 (c)(1),
(2), (4) Date: Feb. 2, 2005

(87) PCT Pub. No.: WO2004/014626

PCT Pub. Date: Feb. 19, 2004

(65) Prior Publication Data

US 2005/0255630 A1    Nov. 17, 2005

(30) Foreign Application Priority Data

Aug. 5, 2002    (EP)    .................................. 02078269

(51) Int. Cl.
*H01L 21/44* (2006.01)
(52) U.S. Cl. ................ 438/114; 438/465; 257/E21.237
(58) Field of Classification Search ................ 438/106, 438/114, 465
See application file for complete search history.

(56) References Cited

U.S. PATENT DOCUMENTS 4,704,187 A * 11/1987 Fujita .......................... 216/14
5,646,315 A *  7/1997 Schultz et al. .............. 549/554

(Continued)

*Primary Examiner*—W. David Coleman
(74) *Attorney, Agent, or Firm*—Peter Zawilski

(57) ABSTRACT

The invention relates to a method of manufacturing a packaged semiconductor device comprising subjecting a metal carrier provided with at least one semiconductor crystal, the semiconductor crystal being provided with an encapsulation, to a singulation step in a dicing apparatus that is provided with a dicing blade comprising diamond grains, in which singulation step the dicing blade cuts, while being cooled with a cooling fluid, through the encapsulation and the metal carrier so as to singulate the at least one semiconductor device, characterized by applying a friction force reducing cooling fluid during the singulation step. Preferably a dicing blade of sintered metal with sharp cleaving diamond grains is used, the sharp cleaving diamond grains being applied in the dicing blade in a concentration smaller than or equal to a maximum concentration, which maximum concentration is defined by the concentration at which the mutual distance between the diamond grains that contribute to the cutting is just large enough to allow removal of substantially all sawing debris. The metal carrier is preferably provided with various features to reduce the amount of metal to be cutted and to prevent vibrations of the metal during the cutting.

18 Claims, 1 Drawing Sheet

U.S. PATENT DOCUMENTS

Figure 1:
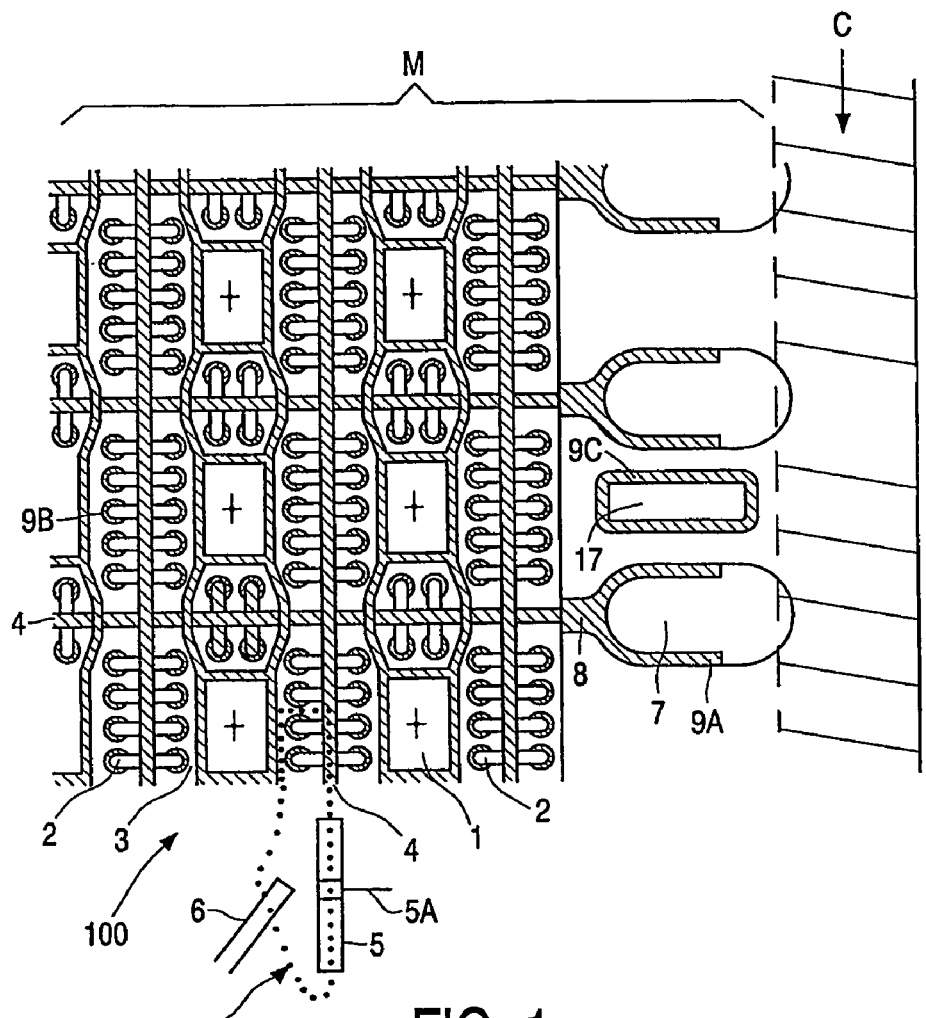

| | | |
|---|---|---|
| 5,678,466 A | 10/1997 | Wahl |
| 5,682,062 A * | 10/1997 | Gaul .......................... 257/686 |
| 5,832,585 A * | 11/1998 | Takiar et al. ................. 29/424 |
| 6,004,867 A * | 12/1999 | Kim et al. .................. 438/459 |
| 6,105,567 A | 8/2000 | Sun et al. |
| 6,284,566 B1 * | 9/2001 | Lee et al. ................... 438/107 |
| 6,400,004 B1 | 6/2002 | Chen et al. |
| 6,401,705 B1 * | 6/2002 | Suzuki ........................ 125/15 |
| 6,405,592 B1 * | 6/2002 | Murari et al. ................. 43/493 |
| 6,407,360 B1 * | 6/2002 | Choo et al. ............ 219/121.67 |
| 6,413,150 B1 | 7/2002 | Blair |
| 6,467,278 B1 * | 10/2002 | Hu et al. ....................... 62/62 |
| 6,723,583 B1 * | 4/2004 | Takahashi et al. .......... 438/114 |
| 6,849,523 B1 * | 2/2005 | Chao et al. ................. 438/460 |
| 6,878,573 B1 * | 4/2005 | Weekamp et al. .......... 438/127 |
| 2001/0005601 A1 | 6/2001 | Lee et al. |
| 2002/0109973 A1 | 8/2002 | Funakoshi et al. |

\* cited by examiner

METHOD AND APPARATUS FOR MANUFACTURING A PACKAGED SEMICONDUCTOR DEVICE, PACKAGED SEMICONDUCTOR DEVICE OBTAINED WITH SUCH A METHOD AND METAL CARRIER SUITABLE FOR USE IN SUCH A METHOD

A substantial part of all packaged semiconductor devices is formed from a copper carrier provided with terminals (the so-called (HV) Quad Flat No-lead package), on which copper carrier at least one semiconductor device is present, the bond pads of which being electrically connected to the terminals by means of wire-bonded connections. The semiconductor device(s) and wire-bonded connections are provided with an encapsulation, usually being a glass-filled epoxy.

In general, the sawing of aforementioned copper carrier is done with a dicing apparatus. Handling of the copper carrier is done via a Film Frame Carrier (FFC), which consists of a plastic ring or a metal ring over which a sticky tape is mounted. The copper carrier is placed on the tape, and firmly pressed to ensure adhesion throughout the exposed surface. Then the FFC with copper carrier is transported into the dicing apparatus and set on top of a ceramic vacuum chuck. After aligning the copper carrier using a camera and specially designed alignment features, the copper carrier is sawn in one direction, rotated and subsequently sawn in the direction perpendicular to the one direction. Sawing is done with a dicing blade comprising diamond grains. The dicing blade cuts through both the epoxy encapsulation and the copper carrier along specifically designed lines, so-called sawing lanes, the cutting depth of the blade ending in the tape thereby leaving only a few tens of micrometer tape. During sawing the dicing blade is being cooled with a cooling fluid.

After sawing, the FFC with the singulated packaged semiconductor device(s) is transported out of the sawing area into a cleaning/drying unit, which uses demineralized or tap water and compressed air to remove sawing debris and (blow-)dry the singulated packaged semiconductor device (s). Sawing debris is formed during the sawing process and consists of small particles of epoxy having a size in the range 0–10 micrometers and somewhat larger copper pieces with a size in the range 20–60 micrometers. The whole FFC is subsequently transported into a magazine, and a new FFC is then loaded.

Some remarks with respect to this process are:

As alternative for FFCs, a chuck (application of a package specific vacuum table) can also be used for transportation of the copper carrier respectively the singulated packaged semiconductor device(s).

With a certain frequency, the blade wear is measured and the z-position of the blade is adjusted to achieve a same cutting depth for all copper carriers during continuous production. The frequency of this step is dependent on the actual blade wear of the applied sawing process.

To accommodate the change in blade shape, the above process must be alternated with a so-called truing process, in which dummy material is used to re-shape the blade into its original 0-hrs quality shape by wearing it substantially.

To remove any copper debris sticking onto the dicing blade, the blade is being worn substantially on a dummy material, thereby removing not only part of the blade but also the debris sticking thereto. This process is called dressing.

Depending on the process quality, the processing-truing-dressing sequence may be adjusted to achieve highest possible processing time for the involved process.

In the known sawing process as described above, the dicing blade is usually composed of a relatively soft, high wearing matrix of a synthetic material (a so-called resin-bonded blade), which matrix is partially filled with industrial diamond grains, and demineralized water is usually applied as cooling fluid. The water needs however not necessarily be demineralized water. Tap water may also be used. Besides water, the cooling fluid may contain certain surface tension lowering additives for enhancing the cooling effect of the cooling fluid.

A problem of the known sawing process is that the efficiency of the process is low. It is observed that in a relatively short time either the product or the dicing blade is destructed.

In order to solve the problem of the known sawing process, the method in accordance with the present invention is characterized in that a friction force reducing cooling fluid is applied during the sawing process. The invention is based on the recognition that during sawing copper sticks to the diamond by which the forces exerted increase in a relatively short time resulting in either breakage of the product to be sawn or of the dicing blade. The invention is further based on the recognition that the use of a friction force reducing cooling fluid substantially reduces the above effect and gives satisfactory results both with respect to the quality of the product to be sawn as with respect to the wear and life time of the dicing blade.

Preferably, a friction force reducing cooling fluid is obtained by adding synthetic oil to water. Suitable oils are for example Sintilo 82 or Miracol 80 from Castrol and AC6227 or AC3676 from Aachener Chemie. Best results were obtained with Sintilo 82. All these oils are environmentally and human friendly and reasonably well mixable to a usable emulsion with water. Suitable concentrations are found in the range between 1 and 10 volume percentages.

It has been found experimentally that the method according to the present invention has important advantages over the known method. By using the method of the present invention the blade wear can be reduced significantly thereby increasing the blade lifetime. This method enables an increase in dicing speed while counteracting blade breakage and/or reduction of product quality. The use of this method also enables a reduction of the amount of cooling fluid that is being used. Another advantage is the fact that the dicing blade needs be less frequently dressed which directly results in a significant increase of the sawing process uptime. A further advantage is that the size of the burrs that are present on the singulated packaged semiconductor devices is smaller than obtained with the known method.

In a preferred embodiment a dicing blade of sintered metal with sharp cleaving diamond grains, the sharp cleaving diamond grains being applied in the dicing blade in a concentration smaller than or equal to a maximum concentration, which maximum concentration is defined by the concentration at which the mutual distance between the diamond grains that contribute to the cutting is just large enough to allow removal of substantially all sawing debris.

If a concentration is selected that is lying above the maximum concentration as defined before, the wear of the blade will be practically nil. Moreover, the burrs appearing on the copper-part of the singulated packaged semiconductor devices will take extreme shapes as is detectable by means of microscopy. Such a high concentration may even result in terminals being thrown out, which is detectable by means of visual inspection. Another effect that probably will take place at such a high concentration is that the dicing blade (completely) silts up with copper.

The sharp cleaving diamond grains are advantageously applied in the dicing blade in a concentration larger than or equal to a minimum concentration, which minimum concentration is defined by the concentration at which the dicing force per diamond grain that contributes to the cutting is just low enough to prevent the diamond grain from breaking out of the dicing blade.

Dicing force can be measured by using a so-called Kistler load cell. However, determination of the dicing force per diamond grain (that contributes to the cutting) is difficult. Nevertheless, other ways are open to a person skilled in the art for determining whether or not he has reached the minimum concentration as defined above. If a concentration is selected that is lying below this minimum concentration, diamond grains will easily break out of the dicing blade thereby leaving holes therein, which holes are detectable by means of microscopy. Furthermore, the blade wear will be extremely high, which is in general measurable with the dicing apparatus itself.

The sharp cleaving diamond grains are advantageously applied with a size in the range from 20 to 60 micrometers. An emulsion of a sawing oil in water is advantageously used as the friction force reducing cooling fluid, the sawing oil having the function of reducing the friction forces being applied with advantage in a volume percentage in the range from 1 to 10. Natural sharp cleaving diamond grains are advantageously used as the diamond grains. As metal carrier advantageously a ductile metal carrier is applied, such as a copper carrier.

The encapsulation advantageously comprises epoxy and is preferably filled with glass up to an amount of 80%. The method according to the invention has proven to be very suitable for the dicing of these kind of products.

Further advantageous embodiments of the method in accordance with the invention are represented by the following measures, taken individually or in combination:

Apply a copper carrier with a design that is symmetrical along the sawing lanes. This measure counteracts asymmetrical wear of the dicing blade. In other words, the wear at one side of the blade's cutting edge will remain substantially the same as that at the other side of the blade's cutting edge. A more symmetrical blade wear enables a better alignment of the dicing blade during sawing.

Counteract sawing of the side rail (part of the copper carrier that is not covered with epoxy) by carrier design or removal thereof beforehand. Sawing of pure copper results in extra blade wear owing to the ductility of the copper material.

Use minimal amount of copper in the sawing lanes. As the amount of copper to be sawn per unit of sawing length is decreased, the blade wear per unit of sawing length is reduced. This is preferably obtained by half-etching the copper in the sawing lane(s). The etch being done from the bottom side of the carrier. In this way, the copper in the sawing lane is not only reduced by say 50% but after molding it will be supported by encapsulant which makes dicing thereof more reliable and controlled. The encapsulant thus is present on both sides of the copper of the carrier in the sawing lane(s).

Experiments have shown that:

Reduction of blade wear is in general not realized with resin-bonded blades combined with (demineralized) water as cooling fluid. The blades in this known sawing process show a wear of about 50–300 μm/meter sawing length, whereas by using the sawing process according to the present invention in combination with a the use of a preferred dicing blade as described above, a wear of about 1–2 μm/meter sawing length can be realized;

Use of the preferred dicing blades but combined with only (demineralized) water leads to breakage of the dicing blades; and Use of the resin-bonded blades of the known sawing process combined with the friction force reducing cooling fluid of the sawing process according to the present invention does in general also does not give the desired effect. Only certain resin-bonded blades, like one that is based on a phenolic resin gave satisfying results in a method according to the invention.

The present invention further relates to a dicing apparatus for subjecting a metal carrier provided with at least one semiconductor device that is provided with an encapsulation to a singulation step, in which singulation step a dicing blade cuts, while being cooled with a cooling fluid, through the encapsulation and the metal carrier so as to singulate the at least one semiconductor device, the dicing apparatus comprising means for supplying a friction force reducing cooling fluid.

Preferably the dicing apparatus comprises a dicing blade of sintered metal with sharp cleaving diamond grains, the sharp cleaving diamond grains being applied in the dicing blade in a concentration smaller than or equal to a maximum concentration, which maximum concentration is defined by the concentration at which the mutual distance between the diamond grains that contribute to the cutting is just large enough to allow removal of substantially all sawing debris.

Finally the present invention relates to a packaged semiconductor device obtained with a method according to the invention and to a metal carrier suitable for use in such a method.

Figure 2:
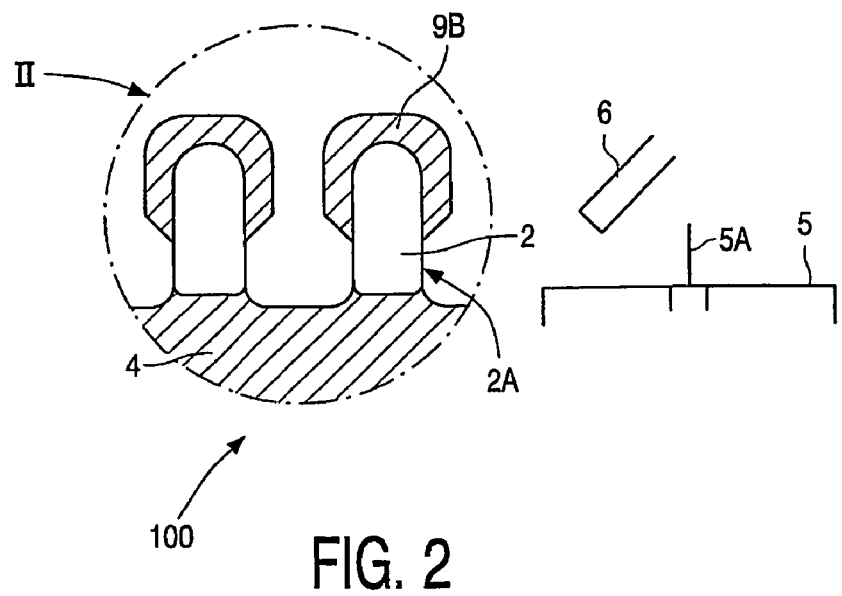

These and other aspects of the invention will be apparent from and elucidated with reference to the embodiment described hereinafter, to be read in conjunction with the drawing, in which FIG. 1 is a schematic top view of a packaged semiconductor device in a relevant stage in the manufacture of the device by means of a method in accordance with the invention, and FIG. 2 is a schematic top view of a detail of the device of FIG. 1 which is indicated therein with II.

The Figs. are diagrammatic and not drawn to scale. Corresponding parts are generally given the same reference number and the same hatching in the various Figs.

FIG. 1 is a schematic top view of a packaged semiconductor device in a relevant stage in the manufacture of the device by means of a method in accordance with the invention. The stage shown in FIG. 1 corresponds with the singulation step of the method. A carrier 100, in this case of copper, comprises a number of die pads 1 on which a semiconductor crystal—not shown in the drawing—is present. The die pads 1 are surrounded by leads 2 which are separated from the die pad by a gap 3 in the carrier 100 and connected to parts of the carrier 100 which function as the sawing lanes 4 for a dicing blade 5 rotating around an axis 5A. The dicing blade 5 comprises a sintered metal with sharp cleaving diamond grains as described above. The semiconductor crystals are connected to the leads 2 to by means of wire-bonds that are also not shown in the drawing. Close to the dicing blade 5 is a nozzle 6 through which a mixture of synthetic oil with water is directed to the dicing blade 5 during the dicing process. In this example a mixture of 5 vol. % of Sintilo 82 of Castrol with (tap) water is used. A this stage the semiconductor crystals are covered by a mold material—not shown in the drawing—which is present in the area M of the carrier 100. The carrier 100 has been clamped during the molding process at the area C of the carrier 100 which is thus free of mold. The mold comprises here an epoxy material that is filled with glass up to 80 percent.

The carrier 100 is provided with a number of features, which contributes to an optimal dicing in the method according to the invention. Firstly, the design of the carrier 100 is symmetrically along the sawing lanes 4. Secondly the copper of the carrier 100 is half-etched from the bottom side in a number of areas of the carrier 100 which are provided with a fine hatching in the Figs. In the sawing lanes 4 this half-etching reduces the amount of copper which is to be sawn. Thirdly the carrier 100 is provided with side-rail slots 7 where no copper is present. These are mainly positioned in the molding area M in front of the sawing lanes 4 were the dicing blade 5 will enter the carrier 100. These slots 7 are only shown in the Fig. at one side of the carrier 100 but will be preferably present at all four sides of the carrier 100. Also the area 8 of the carrier 100 which connects a slot 7 with a sawing lane 4 is preferably half-etched. Further half-etched areas 9A,9B of the carrier 100 are present along side faces of the slots 7 and the leads 2 respectively. These function for anchoring the carrier 100 to the mold by which the carrier is stabilized during the dicing process and protected against vibrations of parts thereof during the dicing process, which vibrations could disturb the dicing process. A similar function is provided by additional slots 17 which are positioned between slots 7 and which are also provided with an half-etched area 9C along there sides in order to anchor the mold to the carrier 100.

FIG. 2 is a schematic top view of a detail of the device of FIG. 1 that is indicated therein with II. It shows a part of the sawing-lane 4 part of the carrier 100 together with two leads 2.

The leads 2 are provided with half-etched areas 9B for anchoring and preventing unwanted vibrations of the carrier 100 during the dicing. Best results with respect to damage and wear of the dicing blade 5 and damage to the singulated semiconductor device are obtained if such half-etched areas are absent where the dicing blade 5 enters the leads 2. Such a side face 2A is preferably straight and plane and runs perpendicular to the face of the dicing blade 5 which enters the leads 2 during dicing. For this reason also a suitable radius of curvature is chosen where the side face 2A of the lead 2 changes to a sideface of the sawing lane (area) 4.

It will be apparent that the invention is not limited to the embodiments described above, but that many variations are possible to those skilled in the art within the scope of the invention.

The invention claimed is:

1. A method of manufacturing a packaged semiconductor device comprising subjecting a metal carrier provided with at least one semiconductor crystal, the semiconductor crystals being provided with an encapsulation, to a singulation step in a dicing apparatus that is provided with a dicing blade comprising diamond grains, in which singulation step the dicing blade cuts, while being cooled with a cooling fluid, through the encapsulation and the metal carrier so as to singulate the at least one semiconductor device, characterized in that a friction force reducing cooling fluid is applied during the singulation step by means of the dicing blade.

2. A method as claimed in claim 1, characterized by the use of synthetic oil as an additive to cooling water as the friction force reducing cooling fluid in the form of an emulsion of the oil in water.

3. A method as claimed in claim 2, characterized by applying the synthetic oil in a volume percentage in the range from 1 to 10.

4. A method as claimed in claim 1. characterized by the use of a dicing blade of sintered metal with sharp cleaving diamond grains, the sharp cleaving diamond grains being applied in the dicing blade in a concentration smaller than or equal to a maximum concentration, which maximum concentration is defined by the concentration at which the mutual distance between the diamond grains that contribute to the cutting is just large enough to allow removal of substantially all sawing debris.

5. A method as claimed in claim 4, characterized by applying the sharp cleaving diamond grains in the dicing blade in a concentration larger than or equal to a minimum concentration, which minimum concentration is defined by the concentration at which the dicing force per diamond grain that contributes to the cutting is just low enough to prevent the diamond grain from breaking out of the dicing blade.

6. A method as claimed in claim 4, characterized by applying the sharp cleaving diamond grains with a size in the range from 20 to 60 micrometers.

7. A method as claimed in any one of the preceding claims, characterized by applying the metal carrier with a design that is symmetrical along sawing lanes along which the dicing blade cuts the carrier.

8. A method as claimed in claim 7, characterized by providing side parts (C) of the carrier with slots that are positioned in front of the sawing lanes.

9. A method as claimed in claim 1, characterized by providing the metal carrier with a reduced thickness at various locations.

10. A method as claimed in claim 9, characterized by reducing the thickness of the metal carrier from the bottom side of the carrier by means of etching.

11. A method as claimed in any one of the preceding claims, characterized by applying a ductile metal carrier like a copper carrier.

12. A method as claimed in claim 1, characterized by applying a, preferably glass filled, epoxy encapsulation.

13. Packaged semiconductor device obtained with a method according to claim 1.

14. Metal carrier suitable for use in method according to claim 1, characterized by a symmetrical design along sawing lanes where the carrier is to be cut.

15. Metal carrier as claimed in claim 14, characterized by the provision of slots positioned in front of the sawing lanes.

16. Metal carrier as claimed in claim 14, characterized by the provision of areas with a reduced thickness.

17. A dicing apparatus for subjecting a metal carrier provided with at least one semiconductor crystal that is provided with an encapsulation to a singulation step, in which singulation step a dicing blade cuts, while being cooled with a cooling fluid, through the encapsulation and the metal carrier so as to singulate the at least one semiconductor device, the dicing apparatus being characterized by the presence of means for supplying a friction force reducing cooling fluid during the singulation step.

18. A dicing apparatus as claimed in claim 17, characterized by a dicing blade of sintered metal with sharp cleaving diamond gains, the sharp cleaving diamond gains being applied in the dicing blade in a concentration smaller than or equal to a maximum concentration, which maximum concentration is defined by the concentration at which the mutual distance between the diamond gains that contribute to the cutting is just large enough to allow removal of substantially all sawing debris.

* * * * *